Jan. 8, 1957 R. L. PRITCHARD 2,777,065

NEGATIVE RESISTANCE OSCILLATOR

Filed Sept. 30, 1954

Inventor:
Robert L. Pritchard,
by Paul A. Frank
His Attorney.

United States Patent Office 2,777,065

Patented Jan. 8, 1957

2,777,065

NEGATIVE RESISTANCE OSCILLATOR

Robert L. Pritchard, Schenectady, N. Y., assignor to General Electric Company, a corporation of New York Application September 30, 1954, Serial No. 459,360

8 Claims. (Cl. 250—36)

Figure 1:
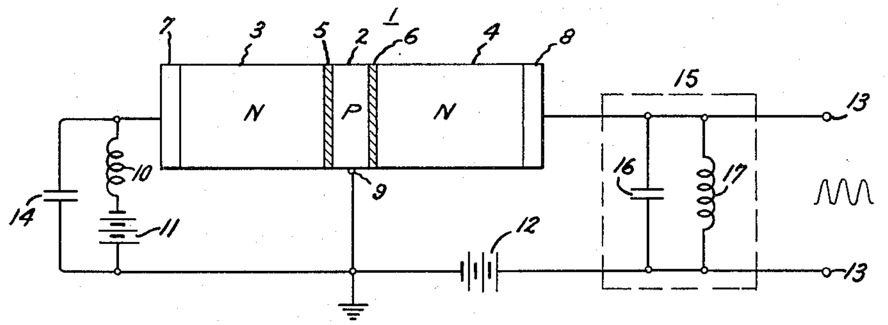

This invention relates to transistor oscillator circuits, and more particularly to junction transistor oscillator circuits.

An object of this invention is to provide a junction transistor oscillator circuit for high frequency operation.

A further object of the invention is to provide a junction transistor oscillator circuit which does not require an external feedback circuit element.

Another object of the invention is to provide a junction transistor oscillator circuit of less complexity than junction transistor oscillator circuits obtainable heretofore.

A still further object of the invention is to provide a junction transistor oscillator circuit utilizing a junction transistor having a negative resistance at high frequencies.

Briefly stated, in accordance with a broad aspect of this invention, a junction transistor oscillator circuit is provided for high frequency operation by adjusting the circuit parameters so that the junction transistor exhibits a negative conductance, and connecting a circuit component which exhibits an effective positive shunt conductance between the collector the base terminals.

Figure 2:
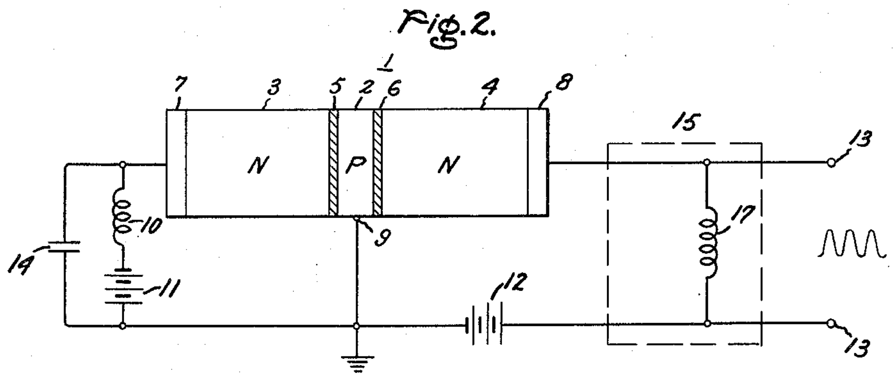

The novel features believed characteristic of the invention are set forth in the appended claims. The invention itself, however, together with further objects and advantages thereof, may best be understood by reference to following description taken in connection with the drawing, in which:

Fig. 1 illustrates one embodiment of the junction transistor oscillator of this invention, and Fig. 2 illustrates an alternative embodiment of the invention.

This invention utilizes, as its central component, a three terminal semiconductor signal translating device which has come to be known in the art as a P–N junction type transistor. P–N junction type transistors comprise a body of solid semiconductive material, as for instance germanium or silicon, having therein a thin zone of one type conductivity material in contact with two zones of opposite type conductivity material forming therewith rectifying or P–N junctions. These devices are denominated as P–N–P or N–P–N junction transistors, depending upon the conductivity type of the various zones. Such devices have broad area contact between opposite type conductivity regions as compared to the point contact type transistor, in which a region of one conductivity type is contacted by two points or line contact electrodes which form small area rectifying contacts with the semiconductor body. A P–N junction transistor such as may be used in this invention is described in vol. 40, Proceedings of the I. R. E., p. 1355 (Nov., 1952), "Fused Impurity P–N–P Junction Transistor," by John S. Saby.

According to well accepted oscillator theory, an oscillator circuit must include a signal translating device having a negative resistance characteristic, or alternatively a regenerative feedback path must be provided between the output and input of the signal translating device used. Point contact semiconductor transistor may be readily made to supply a negative resistance characteristic. This is so because the input resistance of a point contact transistor is composed of two components, the first of which is an inherently negative resistance due to the current multiplication (amplification) characteristic of the point contact transistor. The second component comprises an inherently positive resistance due to the resistance of the point contact and the resistance of the bulk semiconductor material of which the device is constructed. Both of the above components of the input resistance of a point contact transistor may be varied by varying the collector and emitter voltages respectively. By so doing, a negative resistance characteristic may easily be obtained and thus the point contact type transistor may readily serve as a component of a transistor oscillator circuit.

P–N junction transistors have been proven to be quite superior to point contact transistors for a number of reasons, among which are their relatively low noise figure, their freedom from short-circuit instability, their higher power handling capacity, and ease of operation with small power consumption. For these, and other reasons, it is desirable that transistor circuit components be junction type rather than point contact type. Whereas point contact transistors having an inherent negative resistance characteristic, due to their amplification characteristics, readily serve as components for transistor oscillator circuits, the P–N junction type transistor has a current amplification which is always less than unity. Because of this lack of current amplification, junction transistors are unconditionally stable at low frequencies, and do not present negative resistance characteristics. However, junction transistor oscillator circuits may be provided by employing external circuit components which supply regenerative feedback between the output and the input of the junction transistor. This expedient, however, adds complexity to the circuit. According to this invention, I provide a junction transistor oscillator circuit having a minimum number of circuit elements and less complexity than transistor oscillator circuits which employ regenerative feedback elements. This is accomplished by adjusting the external emitter to base impedance thus causing the transistor to exhibit an effective negative resistance characteristic at high frequencies.

The three terminal junction transistors utilized in the present invention, and caused to exhibit negative resistances to permit negative resistance oscillator operation, are not to be confused with certain two terminal junction semiconductor devices which may show negative resistance due to transit time effects. The latter devices develop a negative resistance by having an extremely long transit time corresponding to a transit angle of greater than 180°. Such large transit angles are not consistent with transistor action, which requires, for satisfactory operation, a transit time corresponding to a transit angle of less than 100°. Thus, it would not be possible to utilize the transit time effect to cause a three terminal junction transistor to exhibit a negative resistance.

At low frequencies, the impedances of a junction transistor may be considered to be purely resistive. However, at higher frequencies, the impedances become complex in nature. I have found that when the transistor circuit parameters are chosen so that the external emitter to base impedance is capacitive reactance, the transistor may be made to exhibit a negative resistance between collector and base. The transistor may then serve as an oscillator component without an external regenerative feedback circuit.

For a more complete description of the teaching of this invention, by which a negative resistance may be obtained between collector and base terminals of a junction transistor, use will be made of the grounded base, series parallel, small signal, $h$ parameters. The small signal series parallel $h$ parameters are well known to the art and a thorough description thereof may be found in "Small Signal Parameters for Transistors" by R. L. Pritchard, to be published in the October 1954 issue of "Electrical Engineering."

The series parallel or $h$ parameters are defined by the equations:

$$(1) \qquad e_1=h_{11}i_1+h_{12}e_2$$

$$(2) \qquad i_2=h_{21}i_1+h_{22}e_2$$

where $e_1$ is the emitter-base voltage, $i_1$ is the current flowing in the emitter-base circuit, $e_2$ is the collector-base voltage, and $i_2$ is the current flowing in the collector-base circuit. The $h$ parameters are further defined as the following:

$$(3) \quad h_{11} \text{ (short circuit input impedance)}=\frac{e_1}{i_1} \text{ when } e_2=0$$

$$(4) \quad h_{12} \text{ (the open circuit voltage feedback ratio)}=\frac{e_1}{e_2} \text{ when } i_0$$

$$(5) \quad h_{21} \text{ (the short circuit current transfer ratio)}=\frac{i_2}{i_1} \text{ when } e_2=0$$

and $$(6) \quad h_{22} \text{ (the open circuit output admittance)}=\frac{i_2}{e_2} \text{ when } i_1=0$$

The teachings of this invention may best be understood by analyzing the output of the transistor in terms of its output admittance $Y_{out}$, where admittance is the reciprocal of impedance Z and is composed of the quadrature components of conductance, G, which is a real, or in phase, component, and susceptance, B, which is a reactive or quadrature component.

The output admittance $Y_{out}$ of a transistor having an external emitter-base impedance $Z_1$, and which is characterized by the four $h$ parameters (grounded base configuration) is given by the equation, $$(7) \qquad Y_{out}=h_{22}-\frac{h_{12}h_{21}}{(h_{11}+Z_1)}$$

In Equation 7, each of the $h$ parameters may be determined experimentally for any given junction transistor by appropriate measurements by determining the desired values of current and voltage as indicated by the above relationships defining the parameters (Equations 3 to 6). It is to be understood that these parameters will vary for each transistor and are dependent upon the size, configuration, and other physical constants of the transistor itself. For a detailed discussion of the variation of small signal $h$ parameters of junction transistors as a function of such physical transistor variable as diffusion length, diffusion constant, base width, barrier capacitance, bias, concentration of minority carriers in the base region, and others, reference is herein made to the article, "Frequency Variation of Junction Transistor Parameters," by Richard L. Pritchard, in vol. 42, No. 5, page 786, Proceedings of the I. R. E., May 1954. Since each $h$ parameter is representative of a relationship between voltage and/or current, these parameters may, at low frequencies, at which the transistor impedances are essentially resistive, represent only real components. However, at higher frequencies, at which the transistor impedances cease to be real only, and possess reactive components, the measured voltages and currents also have reactive components and the corresponding $h$ parameters become reactive with increasing frequency. The frequency at which a particular transistor impedance shows reactive components also depends upon the configuration, size, and other physical constants of the transistor.

For a detailed discussion of the variation of $h$ parameters with frequency, reference is herein made to the article "Small Signal Parameters of Grown Junction Transistors at High Frequency," by Robert L. Pritchard and W. N. Coffey, Convention Record of the I. R. E., vol. 2, Part 3 (1954), p. 89. At low frequencies, therefore, all of the $h$ parameters of Equation 7 are real and the resultant admittance $Y_{out}$ is real. Because the quantity $$-\frac{h_{12}h_{21}}{h_{11}+Z_1}$$

is always greater than 0, in the purely resistive case at low frequency, the output admittance is always real and greater than $h_{22}$. With increasing frequency both $h_{22}$ and $h_{12}$ become positive reactive, having phase angles of the order of +80 to +90 degrees. Additionally $h_{11}$ increases in magnitude and also becomes positive reactive having a positive phase angle, while $-h_{21}$ becomes negative reactive and therefore has a negative phase angle. For any given junction transistor, at a given high frequency, at which the $h$ parameters cease to be purely resistive and possess a reactive component, $Z_1$ (the external impedance connected between emitter and base) may be a capacitor having a capacitive $C_1$ and may be selected so that the reactance thereof is greater than $|h_{11}|$. When this condition is satisfied, the quantity $Z_1+h_{11}$ will have a negative reactive component. If the value of $|Z_1|$ chosen (which will equal $$\frac{1}{\omega C_1}$$

since the impedance $Z_1$ chosen is capacitive is large enough, the term $$-\frac{h_{12}h_{21}}{(h_{11}+Z_1)}$$

will have a phase angle in excess of 90 degrees and therefore a negative conductance. When this negative real component exceeds the positive real component of $h_{22}$, the real component $G_{out}$, of $Y_{out}$ is negative.

As an example of the above relationship, the following values for $h$ parameters taken from a typical transistor having a base spreading resistance of 300 ohms, an $\alpha$ cut off frequency of 5 megacycles, a collector capacitance of 10 $\mu\mu$ fd. operated at a frequency of 1 megacycle, are as follows:

$$h_{12}=20\times10^{-3}\ \underline{/+85^\circ}$$

$$-h_{21}=0.95\ \underline{/-10^\circ}$$

$$(h_{11}+Z)=100\ \underline{/-70^\circ}$$

$$h_{22}=60\times10^{-6}\ \underline{/88^\circ}=(2+j60)\times10^{-6}$$

These values inserted into the equation for output admittance, Equation 7, give the value of $$Y_{out}=-154\times10^{-6}+j168\times10^{-6}$$

From this value it may be seen that the real component (conductance) is equal to $G_{out}=-156\times10^{-6}$ mhos. Thus, the junction transistor and the associated capacitive shunt across the emitter to base terminal display a negative conductance. A negative resistance oscillator may be made by connecting between collector and base terminals an impedance having an effective positive shunt conductance with an absolute magnitude less than that of the effective negative shunt conductance $G_{out}$. The impedance which is connected between collector and base may conveniently be a parallel resonant LC circuit in which the capacitive element $C_2$ may be used to adjust the frequency of oscillation. Alternatively, an inductance may be used, in which case the resonant circuit for the transistor oscillator comprises the inductance and the natural capacitance of the transistor. In this case the frequency of oscillation may be regulated by adjusting the value of L the inductance.

In Fig. 1 of the diagram there is shown one embodiment of the invention, including a P–N junction transistor 1 having a P-type zone 2 contiguous with two N-type zones 3 and 4 respectively. P-type zone 2 is extremely thin, of the order of 0.001 inch or less, and forms rectifying P–N junctions 5 and 6 with N-type zones 3 and 4 respectively. Transistor 1 may conveniently be cut from a single crystal of a semiconductor material, as for instance germanium or silicon, grown by seed crystal withdrawal during which the rate of growth is varied in order to produce P–N junctions 5 and 6. The method of growing such crystals is disclosed and claimed in the copending application of Robert N. Hall, Serial No. 304,203, filed August 13, 1952, and assigned to the same assignee as the present invention. A low resistance contact to N-type zone 3 is made by fusion or soldering of a donor material which may conveniently be an alloy of indium and 1% to 10% by weight of arsenic or antimony, to form an emitter contact 7. Likewise, a low resistance contact of the same composition may be fused to N-type zone 4 to form a collector contact 8. A low resistance contact to P-type zone 2 may conveniently be made by fusing, at high temperature, an indium dot to P-type region 2 to form a base contact 9. Base contact 9 is grounded to form a grounded base circuit, and the emitter bias voltage is applied, in the forward direction, through high impedance coil 10, between emitter (7) and base (9) by battery 11. The collector bias voltage is applied, in the reverse direction, between the collector 8 and base 9 by battery 12. The output of the transistor appears between terminals 13. A transistor emitter or collector region may be said to be biased in the forward direction when the polarity of the biasing voltage applied to that region bears the same sign as the sign of the majority conduction carriers contained therein and conventional current flows into the region. Conversely, an emitter or collector may be said to be biased in the reverse direction when the polarity of the biasing voltage bears the opposite sign of the majority conduction carriers contained therein, and conventional current flows out from the region.

Capacitor 14 is connected across the input between emitter and base, and has a value so that the impedance $|Z_1|$, which is equal to $$\frac{1}{wC_1}$$

is greater than $h_{11}$ and is sufficiently large as to cause the output conductance $G_{out}$ to the negative according to the aforementioned relationship, Equation 7. A parallel resonant circuit 15 comprising capacitor ($C_2$), 16, and inductance (L), 17, chosen so that the admittance of the resonant circuit has a negative (inductive) phase angle and a conductance less than the value of $G_{out}$ in Equation 7, is connected between base 9 and collector 8. The frequency of oscillation of the circuit is dependent upon the value of L and the combined values of $C_2$ and the inherent capacitance of the transistor, and may be controlled by varying the value of capacitor 16.

As an example of same values of L and $C_2$ which may be used in the circuit of Fig. 1 to construct a negative resistance junction transistor oscillator in accordance with the invention, the following illustration is given. Using a typical N–P–N junction transistor, an external emitter-base capacitance of 0.1 mfd., and an inductance (L) of 25 millihenries, oscillation was obtained over a range of values of $C_2$ (capacitor 16), varying from 80 to 200 micro-mfd. This corresponds to a frequency range of from 100 to 500 kilocycles. Other circuit element values for which oscillations were obtained are listed in the following table in which $C_1$=external emitter-base capacitance, in microfarads
$L$=external collector-base inductance, in millihenries
$C_2$=external collector-base capacitance, in microfarads
$F$=frequency of oscillations

| $C_1$ | L | $C_2$ | F (kilocycles) |
|---|---|---|---|
| 0.047 | 1 to 25 | 80 to 200 | 100 to 500 |
| 0.01 | 1 to 25 | 80 to 200 | 100 to 500 |
| 0.0047 | 1 to 25 | 80 to 200 | 100 to 500 |
| 0.001 | 1 to 25 | 80 to 200 | 100 to 500 |
| 0.0005 | 1 to 25 | 80 to 200 | 100 to 500 |

It is to be appreciated that the foregoing data are given as examples only and are not to be interpreted as limiting the invention to the particular values given.

In Fig. 2 of the diagram there is shown an alternative embodiment of the invention, in which the resonant circuit of the previous embodiment has been replaced by a simple inductive element 17. This embodiment relies upon the inherent capacitance of transistor 1 in order to form a resonant circuit in the output circuit. The frequency of this embodiment will assume a natural frequency dependent upon the value of the inductance 17 and the natural capacitance of transistor 1. The frequency of oscillation, however, may be varied by varying the inductance of inductor L.

While the above circuit has been described with respect to an N–P–N junction transistor, it is to be appreciated that a P–N–P transistor could be used as well, in which case the polarity of the applied bias voltage would be reversed. This minor change would in no way affect the operation of the device, and it would still function as a grounded base, negative resistance junction transistor oscillator.

While the invention has been described with respect to a particular embodiment, it will be understood that many changes and modifications may be made by those skilled in the art without departing from my invention. Therefore, by the appended claims, I intend to cover all such changes and modifications as fall within the true spirit and scope of the invention.

What I claim as new and desire to secure by Letters Patent of the United States is:

1. A negative resistance oscillator comprising a semiconductor signal translating device including a region of one conductivity type adjoining two regions of opposite conductivity type and forming broad area P–N junctions therewith, a base contact to said one conductivity type region, an emitter contact to one of said opposite conductivity type regions, and a collector contact to the remaining opposite conductivity type region, a capacitive circuit connected between emitter and base contacts, an inductive network connected between collector and base contacts, means for biasing the emitter in the forward direction and means for biasing the collector in the reverse direction.

2. A negative resistance oscillator comprising a three terminal semiconductor signal translating device having emitter, collector and base regions, a capacitive circuit connected between emitter and base, an inductive network connected between collector and base, means for biasing the emitter in the forward direction, and means for biasing the collector in the reverse direction.

3. A negative resistance oscillator comprising a three terminal semiconductor signal translating device having emitter, collector and base regions, a capacitive circuit connected between emitter and base, said signal translating device and said capacitive circuit element exhibiting jointly a negative output conductance, an inductive network connected between collector and base, means for biasing the emitter in the forward direction, and means for biasing the collector in the reverse direction.

4. A negative resistance oscillator comprising a three terminal semiconductor signal translating device having emitter, collector and base regions, a capacitive circuit between emitter and base, said signal translating device and said capacitive circuit element possessing jointly a negative output conductance, an inductive network connected between collector and base, said network possessing a positive conductance less than the absolute value of the output conductance of said signal translating device and said capacitive circuit element, means for biasing the emitter in the forward direction, and means for biasing the collector in the reverse direction.

5. A negative resistance junction transistor oscillator comprising a three terminal junction transistor having emitter, collector and base regions, a capacitive circuit connected between said emitter and base, said transistor and said capacitive circuit element possessing a joint negative output conductance, an inductive network connected between said collector and base, means for biasing the emitter in the forward direction, and means for biasing the collector in the reverse direction.

6. A negative resistance junction transistor oscillator comprising a three terminal junction transistor having emitter, collector and base regions, a capacitive circuit connected between said emitter and base, said capacitive circuit element and said transistor possessing a joint negative output conductance, an inductive network connected between said collector and base, said network possessing a positive conductance less than the absolute value of the output conductance of said transistor and capacitance circuit element, means for biasing the emitter in the forward direction and means for biasing the collector in the reverse direction.

7. A negative resistance junction transistor oscillator comprising a three terminal junction transistor having emitter, collector, and base regions, a capacitive circuit connected between said emitter and base, the value of said element being such that the real component of the joint output admittance of said transistor and said circuit element as defined by the equation $$Y_{out}=h_{22}-\frac{h_{12}\cdot h_{21}}{(h_{11}+Z_1)}$$

is negative at frequencies at which the impedances of said transistor possess reactive components, where $$h_{11}=\frac{e_1}{i_1} \text{ when } e_2=0$$

$$h_{12}=\frac{e_1}{e_2} \text{ when } i_1=0$$

$$h_{21}=\frac{i_2}{i_1} \text{ when } e_2=0$$

$$h_{22}=\frac{i_2}{e_2} \text{ when } i_1=0$$

and $e_1$=Transistor emitter-base alternating current voltage
$e_2$=Transistor collector-base alternating current voltage
$i_1$=Transistor emitter current
$i_2$=Transistor collector current, an inductive network connected between said collector and base, means for biasing the transistor emitter in the forward direction, and means for biasing the transistor collector in the reverse direction.

8. A negative resistance junction transistor oscillator comprising a three terminal junction transistor having emitter, collector, and base regions, a capacitive circuit connected between said emitter and base, the value of said element being such that the real component of the joint output admittance of said transistor and said circuit element as defined by the equation $$Y_{out}=h_{22}-\frac{h_{12}.h_{21}}{(h_{11}+Z_1)}$$

is negative at frequencies at which the impedance of said transistor possess reactive components, where $$h_{11}=\frac{e_1}{i_1} \text{ when } e_2=0$$

$$h_{12}=\frac{e_1}{e_2} \text{ when } i_1=0$$

$$h_{21}=\frac{i_2}{i_1} \text{ when } e_2=0$$

$$h_{22}=\frac{i_2}{e_2} \text{ when } i_1=0$$

and $e_1$=Transistor emitter base alternating current voltage
$e_2$=Transistor collector base alternating current voltage
$i_1$=Transistor emitter current
$i_2$=Transistor collector current, an inductive network connected between said collector and base, said network possessing a positive conductance less than the absolute value of the joint output conductance of said transistor and said capacitive circuit element, means for biasing the transistor emitter in the forward direction, and means for biasing the transistor collector in the reverse direction.

References Cited in the file of this patent

UNITED STATES PATENTS

| | | |
|---|---|---|
| 1,571,278 | Kuhn | Feb. 2, 1926 |
| 2,569,347 | Shockley | Sept. 25, 1951 |

OTHER REFERENCES

Article: "Junction Transistor Equivalent Circuits and Vacuum Tube Analogy," by Giacoletto, pages 1490–1493 of Proc. I. R. E., vol. 40, No. 11 of November 1952.